United States Patent
Watanabe

(10) Patent No.: US 9,224,492 B1
(45) Date of Patent: Dec. 29, 2015

(54) MEMORY MANAGEMENT METHOD, MEMORY STORAGE DEVICE AND MEMORY CONTROLLING CIRCUIT UNIT

(71) Applicant: PHISON ELECTRONICS CORP., Miaoli (TW)

(72) Inventor: Hiroshi Watanabe, Hsinchu (TW)

(73) Assignee: PHISON ELECTRONICS CORP., Miaoli (TW)

( * ) Notice: Subject to any disclaimer, the term of this patent is extended or adjusted under 35 U.S.C. 154(b) by 0 days.

(21) Appl. No.: 14/623,510

(22) Filed: Feb. 17, 2015

(51) Int. Cl.
*G11C 29/04* (2006.01)
*G11C 29/14* (2006.01)
*G11C 29/44* (2006.01)
*G11C 29/50* (2006.01)
*G11C 16/34* (2006.01)
*G11C 16/26* (2006.01)
*G11C 29/00* (2006.01)

(52) U.S. Cl.
CPC ............. *G11C 16/34* (2013.01); *G11C 16/26* (2013.01); *G11C 29/00* (2013.01); *G11C 29/14* (2013.01); *G11C 29/4401* (2013.01); *G11C 29/50004* (2013.01)

(58) Field of Classification Search
CPC .. G11C 29/00; G11C 29/50004; G11C 29/14; G11C 29/4401

USPC ...................................... 365/185.09, 185.24
See application file for complete search history.

(56) References Cited

U.S. PATENT DOCUMENTS

| | | | |
|---|---|---|---|
| 2009/0016103 A1* | 1/2009 | Kang | G06F 11/1068 365/185.03 |
| 2009/0323412 A1* | 12/2009 | Mokhlesi | G11C 11/5642 365/185.02 |
| 2010/0254189 A1* | 10/2010 | Cho | G11C 11/5628 365/185.03 |
| 2013/0297986 A1* | 11/2013 | Cohen | G06F 3/061 714/763 |

* cited by examiner

*Primary Examiner* — Huan Hoang
*Assistant Examiner* — Jay Radke
(74) *Attorney, Agent, or Firm* — Jianq Chyun IP Office

(57) ABSTRACT

An memory management method, a memory storage device and a memory controlling circuit unit are provided. The method comprises: obtaining a threshold voltage distribution of memory cells, wherein the threshold voltage distribution comprises a plurality of states, and each of the states represents a storage status; determining whether a width of a gap window between two neighboring states among the states is less than a threshold value; and if the width of the gap window is less than the threshold value, eliminating one of the two neighboring states.

21 Claims, 16 Drawing Sheets

MEMORY MANAGEMENT METHOD, MEMORY STORAGE DEVICE AND MEMORY CONTROLLING CIRCUIT UNIT

BACKGROUND

1. Technical Field

The invention relates to a memory management method, and more particularly, relates to a memory management method, a memory storage device and a memory controlling circuit unit for a rewritable non-volatile memory module.

2. Description of Related Art

The markets of digital cameras, cellular phones, and MP3 players have expanded rapidly in recent years, resulting in escalated demand for storage media by consumers. The characteristics of data non-volatility, low power consumption, and compact size make a rewritable non-volatile memory module (e.g., flash memory) ideal to be built in the portable multimedia devices as cited above.

Generally, when using time and/or accessing count of the rewritable non-volatile memory module increases, data read from the memory cells in the rewritable non-volatile memory module may contains more and more error bits. A data correction operation may be performed to correct those error bits. However, the data correction operation usually costs a lot of time.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The invention is directed to a memory management method, a memory storage device, and a memory controlling circuit unit, which are capable of reducing the error bits contained in data read from the rewritable non-volatile memory module.

A memory management method for a rewritable non-volatile memory module comprises a plurality of memory cells according to an exemplary embodiment of the invention is provided. The memory management method comprises: obtaining a threshold voltage distribution of the memory cells, wherein the threshold voltage distribution comprises a plurality of states, and each of the states represents a storage status; determining whether a width of a gap window between two neighboring states among the states is less than a threshold value; and if the width of the gap window is less than the threshold value, eliminating one of the two neighboring states.

A memory storage device according to another exemplary embodiment of the invention is provided. The memory storage device comprises a connection interface unit, a rewritable non-volatile memory module and a memory controlling circuit unit. The connection interface unit is configured to couple to a host system. The rewritable non-volatile memory module comprises a plurality of memory cells. The memory controlling circuit unit is coupled to the connection interface unit and the rewritable non-volatile memory module, wherein the memory controlling circuit unit is configured to obtain a threshold voltage distribution of the memory cells, wherein the threshold voltage distribution comprises a plurality of states, and each of the states represents a storage status, wherein the memory controlling circuit unit is further configured to determine whether a width of a gap window between two neighboring states among the states is less than a threshold value, wherein if the width of the gap window is less than the threshold value, the memory controlling circuit unit is further configured to eliminate one of the two neighboring states.

A memory controlling circuit unit configured to control a rewritable non-volatile memory module according to another exemplary embodiment of the invention is provided. The memory controlling circuit unit comprises a host interface, a memory interface and a memory management circuit. The host interface is configured to couple to a host system. The memory interface is configured to couple to the rewritable non-volatile memory module, wherein the rewritable non-volatile memory module comprises a plurality of memory cells. The memory management circuit is coupled to the host interface and the memory interface, wherein the memory management circuit is configured to obtain a threshold voltage distribution of the memory cells, wherein the threshold voltage distribution comprises a plurality of states, and each of the states represents a storage status, wherein the memory management circuit is further configured to determine whether a width of a gap window between two neighboring states among the states is less than a threshold value, wherein if the width of the gap window is less than the threshold value, the memory management circuit is further configured to eliminate one of the two neighboring states.

Based on the above, the gap window with inappropriate width between two neighboring states may be found, and one of the two neighboring states may be eliminated. Accordingly, error bits contained in data read from the rewritable non-volatile memory module may be reduced and the lifetime of the rewritable non-volatile memory module may be extended.

To make the above features and advantages of the disclosure more comprehensible, several embodiments accompanied with drawings are described in detail as follows.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are comprised to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
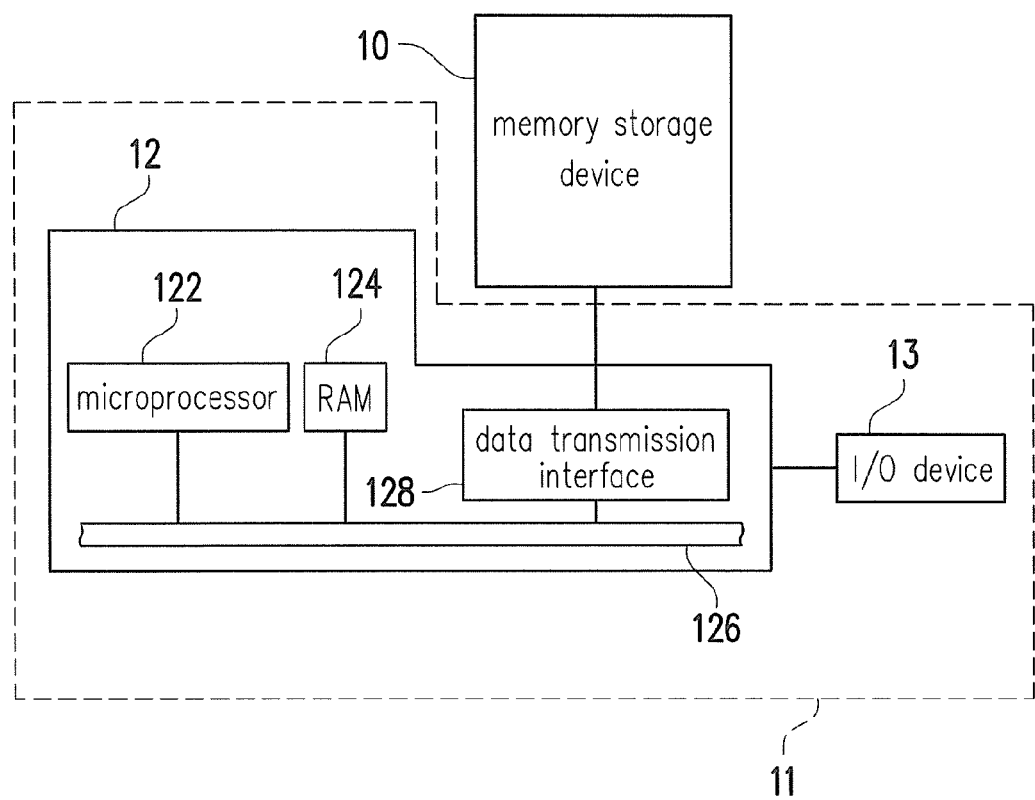
FIG. 1 is a schematic diagram illustrating a host system and a memory storage device according to an exemplary embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one," "one or more," and "and/or" are open-ended expressions that are both conjunctive and disjunctive in operation. For example, each of the expressions "at least one of A, B and C," "at least one of A, B, or C," "one or more of A, B, and C," "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Generally, a memory storage device (also known as a memory storage system) comprises a rewritable non-volatile memory module and a controller (also known as a control circuit). The memory storage device is usually configured together with a host system so that the host system may write data to or read data from the memory storage device.

Figure 2:
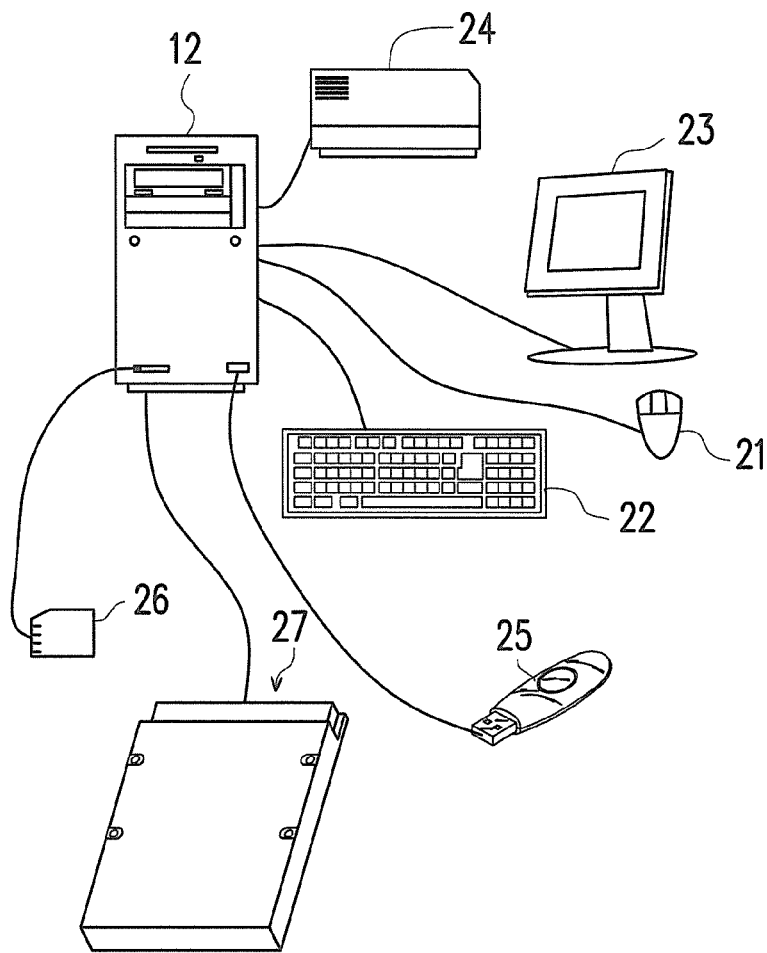
FIG. 2 is a schematic diagram of a computer, an input/output device, and a memory storage device according to an exemplary embodiment of the invention.

FIG. 1 is a schematic diagram illustrating a host system and a memory storage device according to an exemplary embodiment of the invention. FIG. 2 is a schematic diagram of a computer, an input/output device, and a memory storage device according to an exemplary embodiment of the invention.

Referring to FIG. 1, a host system 11 comprises a computer 12 and an input/output (I/O) device 13. The computer 12 comprises a microprocessor 122, a random access memory (RAM) 124, a system bus 126, and a data transmission interface 128. For example, the I/O device 13 comprises a mouse 21, a keyboard 22, a display 23 and a printer 24 as shown in FIG. 2. It should be understood that the devices illustrated in FIG. 2 are not intended to limit the I/O device 13, and the I/O device 13 may further comprise other devices.

In an exemplary embodiment, the memory storage device 10 is coupled to other devices of the host system 11 through the data transmission interface 128. By using the microprocessor 122, the random access memory 124 and the Input/Output (I/O) device 13, data may be written into the memory storage device 10 or may be read from the memory storage device 10. For example, the memory storage device 10 may be a rewritable non-volatile memory storage device such as a flash drive 25, a memory card 26, or a solid state drive (SSD) 27 as shown in FIG. 2.

Figure 3:
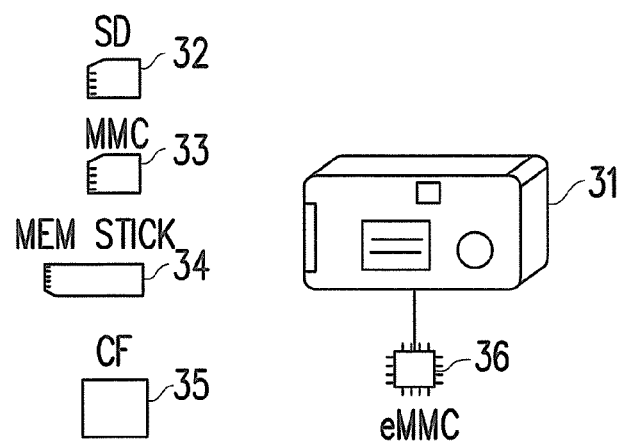
FIG. 3 is a schematic diagram illustrating a host system and a memory storage device according to an exemplary embodiment of the invention.

FIG. 3 is a schematic diagram illustrating a host system and a memory storage device according to an exemplary embodiment of the invention.

Generally, the host system 11 may be any system capable of substantially cooperating with the memory storage device 10 for storing data. In the present exemplary embodiment, the host system 11 is illustrated as a computer system. However, in another exemplary embodiment, the host system 11 may be a system such as a digital camera, a video camera, a telecommunication device, an audio player, or a video player. For example, when the host system is a digital camera (video camera) 31, the rewritable non-volatile memory storage device may be a SD card 32, a MMC card 33, a memory stick 34, a CF card 35 or an embedded storage device 36 (as shown in FIG. 3). The embedded storage device 36 comprises an embedded MMC (eMMC). It should be mentioned that the eMMC is directly coupled to a substrate of the host system.

Figure 4:
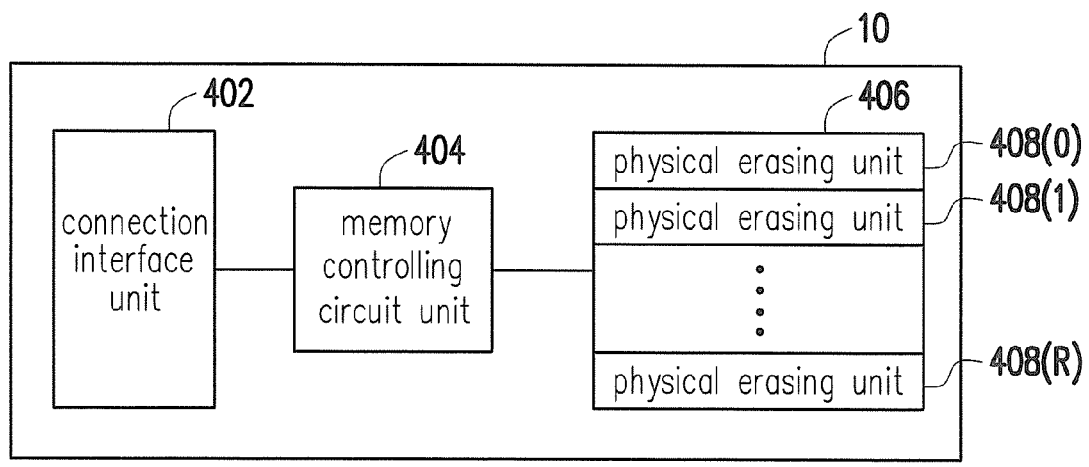
FIG. 4 is a schematic block diagram illustrating the memory storage device depicted in FIG. 1.

FIG. 4 is a schematic block diagram illustrating the memory storage device depicted in FIG. 1.

Referring to FIG. 4, the memory storage device 10 comprises a connection interface unit 402, a memory controlling circuit unit 404 and a rewritable non-volatile memory module 406.

In the present exemplary embodiment, the connection interface unit 402 is compatible with a serial advanced technology attachment (SATA) standard. However, the invention is not limited thereto, and the connection interface unit 402 may also be compatible with a Parallel Advanced Technology Attachment (PATA) standard, an Institute of Electrical and Electronic Engineers (IEEE) 1394 standard, a peripheral component interconnect (PCI) Express interface standard, a universal serial bus (USB) standard, a secure digital (SD) interface standard, a Ultra High Speed-I (UHS-I) interface standard, a Ultra High Speed-II (UHS-II) interface standard, a memory sick (MS) interface standard, a multi media card (MMC) interface standard, an embedded MMC (eMMC) interface standard, a Universal Flash Storage (UFS) interface standard, a compact flash (CF) interface standard, an integrated device electronics (IDE) interface standard or other suitable standards. The connection interface unit 402 and the memory controlling circuit unit 404 may be packaged into one chip, or the connection interface unit 402 is distributed outside of a chip containing the memory controlling circuit unit 404.

The memory controlling circuit unit 404 is configured to execute a plurality of logic gates or control commands which are implemented in a hardware form or in a firmware form, so as to execute operations of writing, reading or erasing data in the rewritable non-volatile memory module 406 according to the commands of the host system 11.

The rewritable non-volatile memory module 406 is coupled to the memory controlling circuit unit 404 and configured to store data written from the host system 11. The rewritable non-volatile memory module 406 has multiple physical erasing units 408(0) to 408(R). For example, the physical erasing units 408(0) to 408(R) may belong to the same memory die or belong to different memory dies. Take a NAND type flash memory as an example, in which a physical erasing unit comprises a plurality of NAND strings. Each of the NAND strings may comprise a plurality of transistors connected in series with each other.

Figure 5A:
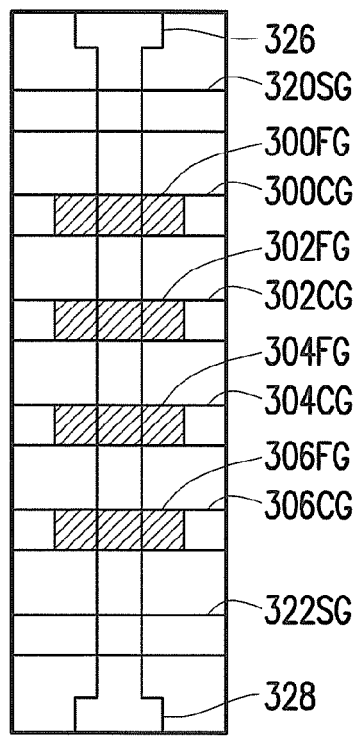
FIG. 5a illustrates a top view of a NAND string according to an exemplary embodiment of the invention.
Figure 5B:
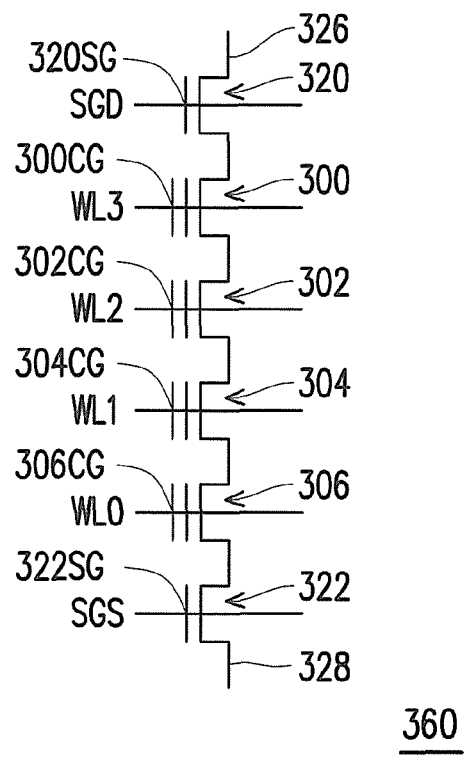
FIG. 5b illustrates an equivalent circuit diagram of a NAND string according to an exemplary embodiment of the invention.

FIG. 5a illustrates a top view of a NAND string according to an exemplary embodiment of the invention. FIG. 5b illustrates an equivalent circuit diagram of a NAND string according to an exemplary embodiment of the invention.

Referring to FIG. 5a and FIG. 5b, a NAND string 360 comprises transistors 320, 300, 302, 304, 306 and 322. Here, the transistor 320 is a drain select gate transistor, each of the transistors 300, 302, 304 and 306 is a cell transistor, and the transistor 322 is a source select gate transistor. A circuit between a drain diffusion layer 236 and a source diffusion layer 328 may also be referred to as a NAND string. A bit line is connected to a drain contact point on the drain diffusion layer 326 and expanded parallel to the NAND string on an upper metal layer. A select gate 320SG on the transistor 320 is coupled to a select line SGD; a control gate 300CG on the transistor 300 is coupled to a word line WL3; a control gate 302CG on the transistor 302 is coupled to a word line WL2; a control gate 304CG on the transistor 304 is coupled to a word line WL1; a control gate 306CG on the transistor 306 is coupled to a word line WL0; and a select gate 322SG on the transistor 322 is coupled to a select line SGS. Each of the transistors 300, 302, 304 and 306 further comprises a charge-storage layer. The charge-storage layer is configured to store electrons or holes. In the present exemplary embodiment, the charge-storage layer is referred to as a floating gate, and a material thereof comprises a highly-doped poly-silicon. However, in another exemplary embodiment, the charge-storage layer may comprise a charge-trapping layer, such as a stacking layer which is composed of silicon, oxide and nitrogen, or other materials capable of storing electrons or holes, and the invention is not limited thereto. In the exemplary embodiment of FIG. 5a, the transistor 300 comprises a floating gate 300FG; the transistor 302 comprises a floating gate 302FG; the transistor 304 comprises a floating gate 304FG; and the transistor 306 comprises a floating gate 306FG. Herein, the transistors 300, 302, 304 and 306 may also be referred to as memory cells.

Figure 5C:
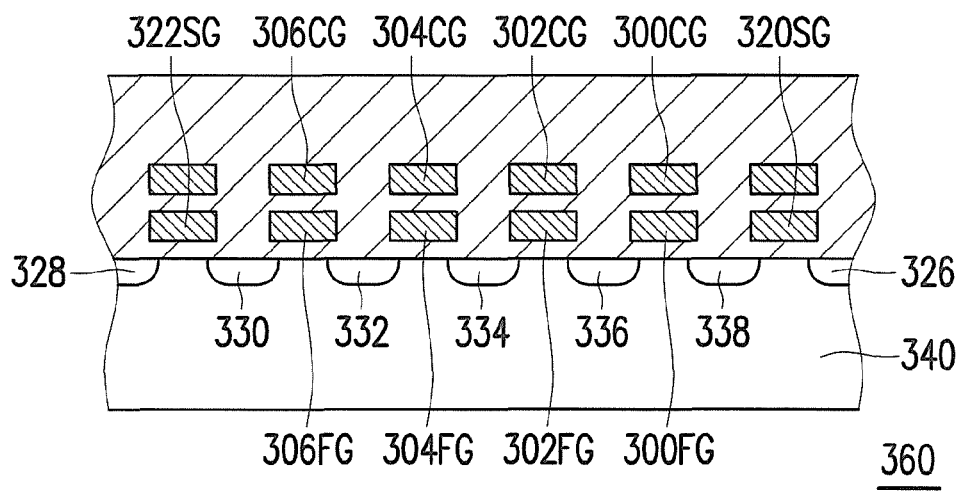
FIG. 5c illustrates a side view of a NAND string according to an exemplary embodiment of the invention.

FIG. 5c illustrates a side view of a NAND string according to an exemplary embodiment of the invention. Referring to FIG. 5a to FIG. 5c, the NAND string 360 is disposed on a P-well 340 on a substrate. The control gates 300CG, 302CG, 304CG and 306CG are disposed on the floating gates 300FG, 302FG, 304FG and 306FG, respectively. A dielectric layer is disposed between the control gates 300CG, 302CG, 304CG, 306CG and the floating gates 300FG, 302FG, 304FG, 306FG. Another dielectric layer is disposed between the floating gates 300FG, 302FG, 304FG, 306FG and the substrate. The last dielectric layer is further expanded to cover the channels of the select gates 322SG and 320SG. Diffusion layers 330, 332, 334, 336 and 338 may be shared by the adjacent transistors in FIG. 5a to FIG. 5c, and a source or a drain of one transistor may be formed by two adjacent diffusion layers. In the case that data is written (i.e., programmed) into one of the transistors 300, 302, 304 and 306, a suitable voltage may be applied to the control gate of the select gate 320SG, while the control gate of the select gate 322SG is ground, so that the transistor 320 may be turned on while the transistor 322 may be turned off By this way, each bit line can select the program and the program-inhibit of the corresponding NAND string. The program voltage or the pass voltage may be applied on the entire cell transistors on the NAND string. The program voltage may be applied to the control gate on the transistor to be programmed, and the pass voltage may be applied to the control gates on the other transistor not to be programmed. Herein, take the control gate 302CG as an example. The program voltage may be applied on control gate 302CG and the pass voltage may be applied on control gates 300CG, 304CG and 306CG, while the transistor 320 may be turned on while the select gates 322SG is turned off Electrons are moved from the channel between the diffusion layers 334 and 336 to the floating gate 302FG, while the corresponding bit line is grounded. Otherwise, such tunneling is prohibited by a charge-pumping or a capacitance coupling. After the electrons are injected into the floating gate 302FG, a threshold voltage of the transistor 302 is increased from an erased state; and then the transistor 302 is programmed. The erased state is made by the erase operation before such a programming operation. The erase operation is done at each block comprising plenty of NAND strings. A high voltage is applied on the P-well 340 involving the block to be erased. A block selection signal which corresponds to the block to be erased is high, while the common gate lines are grounded. By this way, the entire cell transistors in the selected block are erased at the same moment (Block Erase). It should be noted that, in another exemplary embodiment, the NAND string 360 may also comprise more of the memory cells, and the number of the memory cells in one NAND string is not particularly limited in the invention. Moreover, FIG. 5a to FIG. 5c are merely an example, and the structures and the circuits of the memory cells in the rewritable non-volatile memory module 406 is not particularly limited in the invention. For instance, in an exemplary embodiment, a plurality of memory cells are stacked over one another thereby forming a vertical channel flash memory, which is a type of three dimension NAND.

Figure 5D:
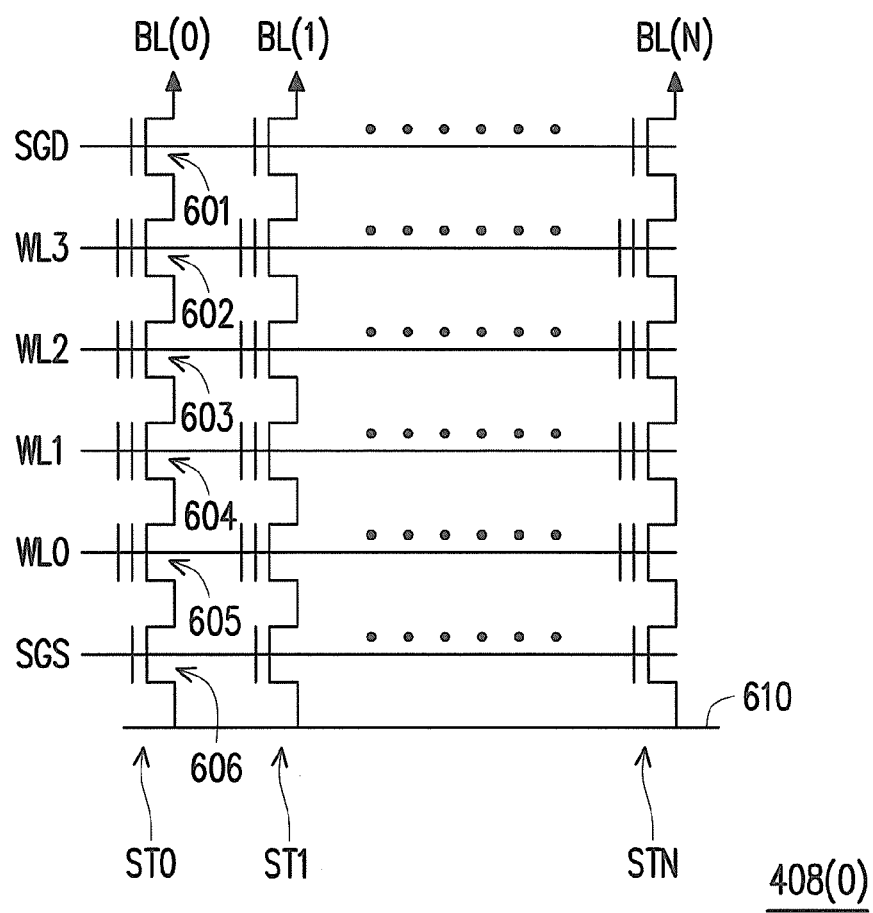
FIG. 5d illustrates a physical erasing unit according to an exemplary embodiment.

FIG. 5d illustrates a physical erasing unit according to an exemplary embodiment of the invention.

Referring to FIG. 5d, take a physical erasing unit 408(0) as an example, the physical erasing unit 408(0) comprises a plurality of NAND strings ST0 to STN. The NAND string ST0 comprises transistors 601 to 606. Here, the transistors 601 is a drain select gate transistor, each of the memory cells 602 to 605 is a memory cell, and the transistor 606 is a source select gate transistor. The NAND strings ST0 to STN are similar to the NAND string 360 depicted in FIG. 5b, thus related description is omitted hereinafter. The bit lines BL(0) to BL(N) are connected to the drain diffusion layers of the drain select gates by the bit line contacting and expanding parallel to the NAND strings ST to STN, respectively. The word line WL0 connects the control gates of the transistors 605 along NAND strings ST0 to STN and is expanded perpendicular to the N+1 NAND strings that are parallel each other. The word line WL1 connects the control gates of the transistors 604 along NAND strings ST0 to STN and is expanded perpendicular to the N+1 NAND strings that are parallel each other. The word line WL2 connects the control gates of the transistors 603 along NAND strings ST0 to STN and is expanded perpendicular to the N+1 NAND strings that are parallel each other. The word line WL3 connects the control gates of the transistors 602 along NAND strings ST0 to STN and is expanded perpendicular to the N+1 NAND strings that are parallel each other. Then, the physical erasing unit 408(0) may also comprise the word lines WL0 to WL3 and the bit lines BL(0) to BL(N). By this way, each memory cell in the physical erasing unit 408(0) is on the intersection of a word line and a bit line. In another exemplary embodiment, the source line 610 is shared with another physical erase unit. One or more physical erasing units sharing the source line 610 may form a physical block. The memory cells connected to the same word line form a physical programming unit.

In the present exemplary embodiment, the physical programming unit is a minimum unit for programming. That is, the physical programming unit is the minimum unit for writing data. For example, the physical programming unit is a physical page or a physical sector. In case the physical programming unit is the physical page, each physical programming unit usually comprises a data bit area and a redundant bit area. The data bit area has multiple physical sectors configured to store user data, and the redundant bit area is configured to store system data (e.g., an error correcting code). In the present exemplary embodiment, the data bit area contains 32 physical sectors, and a size of each physical sector is 512-byte (B). However, in other exemplary embodiments, the data bit area may also comprise 8, 16, or more or less of the physical sectors, and amount and sizes of the physical sectors are not limited in the invention.

On the other hand, the NAND strings ST0 to STN are all coupled to a source line 610. When the physical erasing unit 408(0) is to be erased, an erasing voltage may be applied to the P-well 340 involving at least the physical erasing unit 408(0), so that the electrons or holes stored in the floating gates in the physical erasing unit 408(0) may leave the floating gates. In the present exemplary embodiment, the physical erasing unit is a minimum unit for erasing. Namely, each physical erasing unit contains the least number of memory cells to be erased at the same moment. For instance, the physical erasing unit is a physical block.

The rewritable non-volatile memory module 406 may be a Single Level Cell (SLC) NAND flash memory module, a Multi-Level Cell (MLC) NAND flash memory module (i.e., a flash memory module capable of storing two bits of data in one memory cell), a Triple Level Cell (TLC) NAND flash memory module (i.e., a flash memory module capable of storing three bits of data in one memory cell), other flash memory modules or any memory module having the same features.

Each of the memory cells in the rewritable non-volatile memory module 406 may store one or more bits by controlling a threshold voltage of the memory cell. More specifically, in each of the memory cells, a charge-storage layer is provided between a control gate and a channel. Amount of electrons in the charge-storage layer may be changed by applying a write voltage (i.e., the program voltage) to the control gate, and thereby controlling the threshold voltage of the memory cell. This procedure of changing the threshold voltage is also known as "writing data into the memory cell" or "programming the memory cell." Each of the memory cells in the rewritable non-volatile memory module 406 has a plurality of storage statuses (or, states) which are determined by the threshold voltage. The number of storage status is increased as the number of bits in per cell is increased. Moreover, to which of the storage statuses the memory cell belongs may be determined by applying one or more read voltages, so as to obtain the one or more bits stored in the memory cell.

Figure 6:
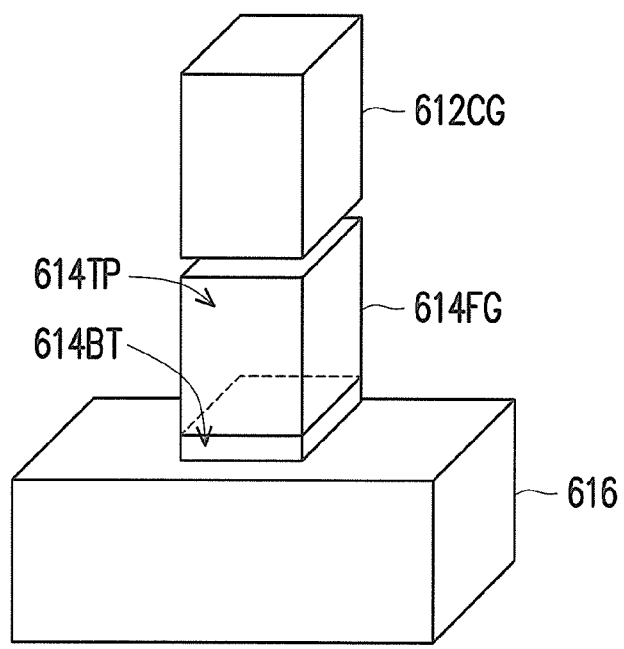
FIG. 6 illustrates a floating gate memory cell according to an exemplary embodiment of the invention.

FIG. 6 illustrates a floating gate memory cell according to an exemplary embodiment of the invention.

Referring to FIG. 6, a floating gate memory cell may comprise a control gate 612CG, a floating gate 614FG and a P-well 340. When the control gate 612CG is positively biased and the P-well substrate 340 is grounded via the bit lines, the top surface 614TP of the floating gate 614FG is negatively charged and the bottom surface 614BT of the floating gate 614FG is positively charged. Therefore, the charge inside the floating gate 614FG is split into the top surface 614TP and the bottom surface 614BT by a vertical electric field across the floating gate 614FG. The charge at the bottom surface 614BT cancel out with that at the top surface 614TP while the net charge stored in the floating gate 614FG is zero (i.e., neutral). Note here that the sum of the charge at 614BT and that at 614TP is the net charge stored in the 614FG. The charge at the bottom surface 614BT and that at the top surface 614TP doesn't cancel out each other while the net charge stored in the floating gate 614FG is not zero (i.e., not neutral). In this event, if the net charge is positive, then the state may be regarded as erased. If the net charge is negative, then the state may be regarded as programmed.

In the present exemplary embodiment, if the net charge stored in the floating gate 614FG is zero (i.e., neutral), a theoretical upper limit of the surface charge (i.e., the charge at the bottom surface 614BT and/or the charge at the top surface 614TP) is $qN_D \times H$, where q is the elementary charge, $N_D$ is the donor concentration in volume, and H is the high of the floating gate 614FG. In the present exemplary embodiment, $qN_D \times H$ may be regarded as the theoretical limit of the surface charge. In another exemplary embodiment that charge-storage layer is the charge trapping layer (CTL), $qN_t$ may be regarded as the theoretical limit of the surface charge of the CTL memory cell, where $N_t$ is the surface concentration of traps the CTL. The above estimation of the theoretical limit of the surface charge may also be applicable to the vertical channel type NAND flash. The invention is not limited thereto.

Figure 7:
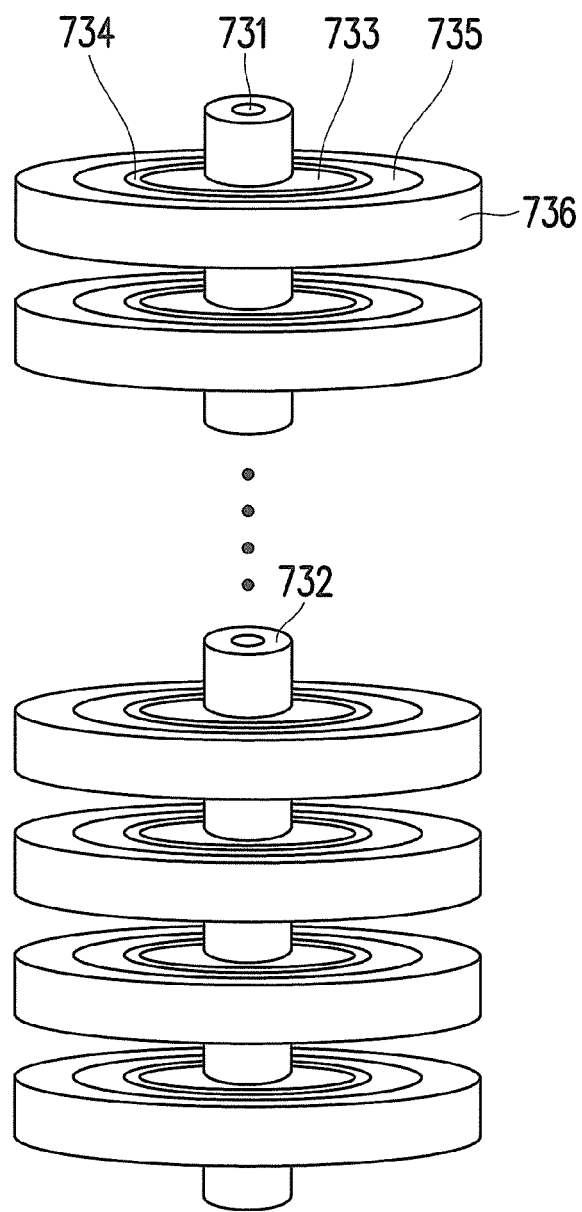
FIG. 7 illustrates a vertical channel type NAND flash according to an exemplary embodiment of the invention.

FIG. 7 illustrates a vertical channel type NAND flash according to an exemplary embodiment of the invention.

Referring to FIG. 7, a vertical channel type NAND flash may comprise a thin hole (or thin insulating via) 731, a Poly-Si (or amorphous Si) channel 732, a tunnel film 733, a charge trapping layer 734, a blocking film 735, and a control gate 736. The theoretical limit of the surface charge of the vertical channel type NAND flash may be regarded as $qN_t$, similar to that in the above exemplary embodiment.

Figure 8A:
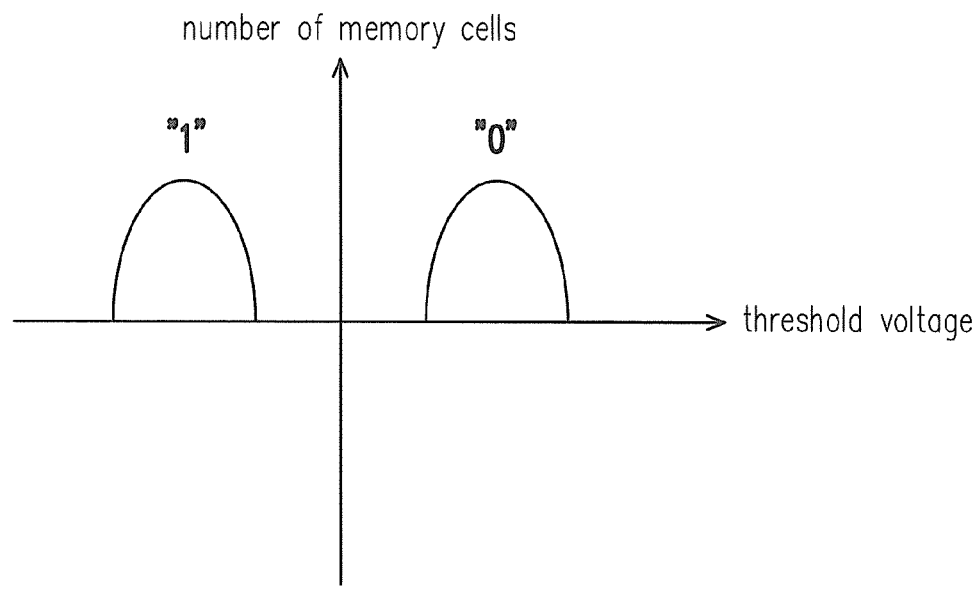
FIGS. 8a and 8b are the threshold voltage distributions corresponding to write data stored in memory cells according to an exemplary embodiment of the invention.
Figure 8B:
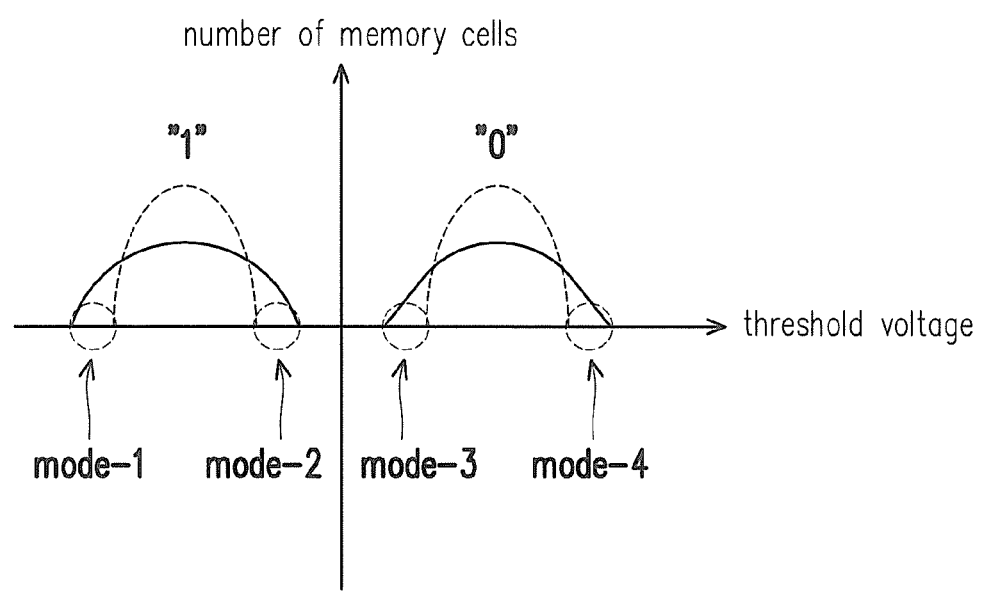

FIGS. 8a and 8b are a threshold voltage distribution corresponding to write data stored in memory cells according to an exemplary embodiment of the invention.

Referring to FIG. 8a that takes the SLC NAND flash memory for example, in which each of the memory cells has two storage statuses (or, states) divided by different threshold voltage distributions, and the storage statuses represent bit "1" and "0," respectively. For example, the threshold voltage distribution with lower peak represents bit "1," and the threshold voltage distribution with higher peak represents bit "0." However, after memory cells are programmed and erased repeatedly (i.e., P/E cycle), the threshold voltage distribution of the SLC NAND flash memory becomes degraded (i.e., flatter and wider), as illustrated in FIG. 8b. This is called the endurance degradation.

In the present exemplary embodiment, there are four degradation modes to degrade the endurance of memory cells. Taking FIG. 8b as an example, mode-1 expands the lower tail of the distribution representing bit "1," mode-2 expands the upper tail of the distribution representing bit "1," mode-3 expands the lower tail of the distribution representing bit "0," and mode-4 expands the upper tail of the distribution representing bit "0." In mode-1, the holes are captured by interface shallow traps near channel surface at erase; and thereby the additional positive charges are stored close to channel inside tunnel oxide. This additional positive charge near to the channel surface exceeds the theoretical limitation of the memory cells and then expands the lower tail of the state "1." Mode-2 is further classified to option-1 and option-2. In option-1 of mode 2, some amount of negative charge is stored by deep trap close to channel inside tunnel oxide at the erase or at the last program. Since this increases threshold voltage, the distribution of "1" may provide tails to the gap window. In option-2 of mode 2, electrons are trapped in deep trap close to floating gate at the last program; and hence electrons' FN tunneling from floating gate to channel (i.e., FN erasing) at the subsequent erase is suppressed by this negative charge. Since the erase is incomplete, the tail of the distribution of "1" is expanded. Mode-3 is further classified to option-1 and option-2. In option-1 of mode 3, some amount of positive charge is stored by shallow trap close to channel inside tunnel oxide at the program or at the last erase. Since this positive charge decreases threshold voltage, the distribution of "0" may provide tails to the gap window. In option-2 of mode 3, electrons are trapped in deep trap close to channel at the last erase; and hence electrons' FN tunneling from channel to floating gate (i.e., FN programming) at the subsequent programming is suppressed by this negative charge. Since the programming is incomplete, the lower tail of the distribution of "0" is expanded. In mode-4, electrons are captured by interface deep traps at program. Since these negative charges are close to channel, these negative charges can more notably increase the threshold voltage. By this way, the additional negative charge inside tunnel oxide expands the upper tail of the distribution of "0." However, there may be more types of the degradation modes causing the endurance degradation, which is not limited in the invention. In addition, those degradation modes may influence the endurance degradation of other types of memory cells.

Figure 9:
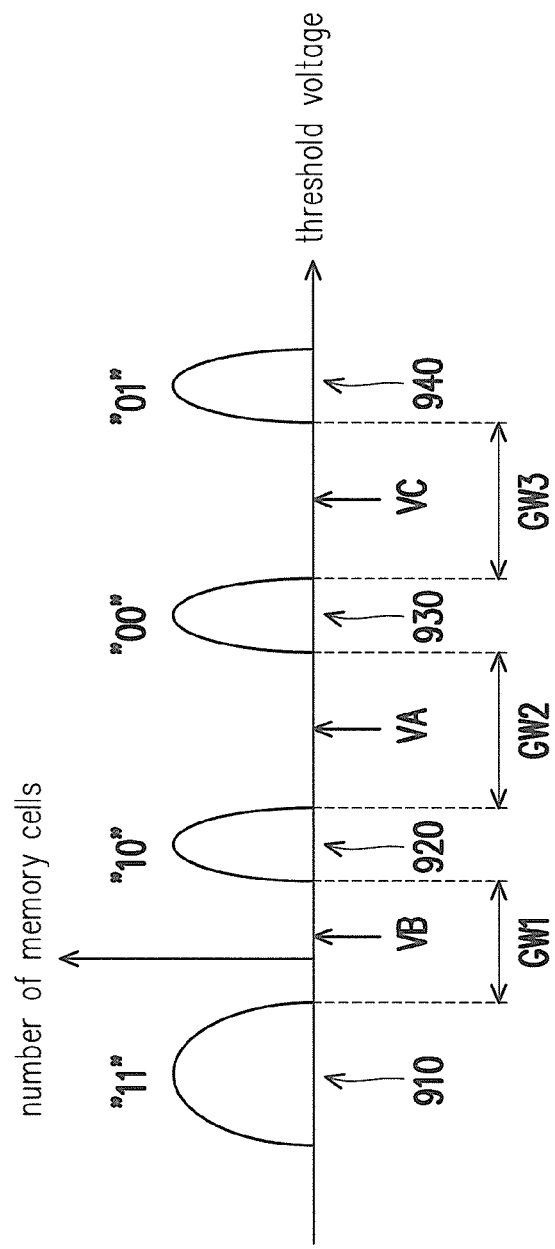
FIG. 9 illustrates a threshold voltage distribution corresponding to write data stored in memory cells according to an exemplary embodiment of the invention.

FIG. 9 illustrates a threshold voltage distribution corresponding to write data stored in the memory cells according to an exemplary embodiment of the invention.

Referring to FIG. 9 that takes the MLC NAND flash memory for example, each of the memory cells has four storage statuses (or, states) depending on different threshold voltages, and the storage statuses represent bits "11," "10," "00" and "01," respectively. In other words, each of the storage statuses comprises the left digit (LD) and the right (RD). In the present exemplary embodiment, among the storage statuses (i.e., "11," "10," "00" and "01"), a first digit counted from the left is the LD, and a second digit counted from the left is the RD. Accordingly, in this exemplary embodiment, each of the memory cells may store two bits with those two digits since each digit represents a bit. It should be understood that, the storage statuses corresponding to the threshold voltage as illustrated in the FIG. 9 are merely an example. In another exemplary embodiment of the invention, the storage statuses corresponding to the threshold voltage may also have an arrangement of "11," "10," "00" and "01" that is arranged according to the threshold voltage from small to large, or other arrangements. In addition, in another exemplary embodiment, it can also be defined that the first digit counted from the left is the RD, and the second digit counted from the left is the LD.

Figure 10:
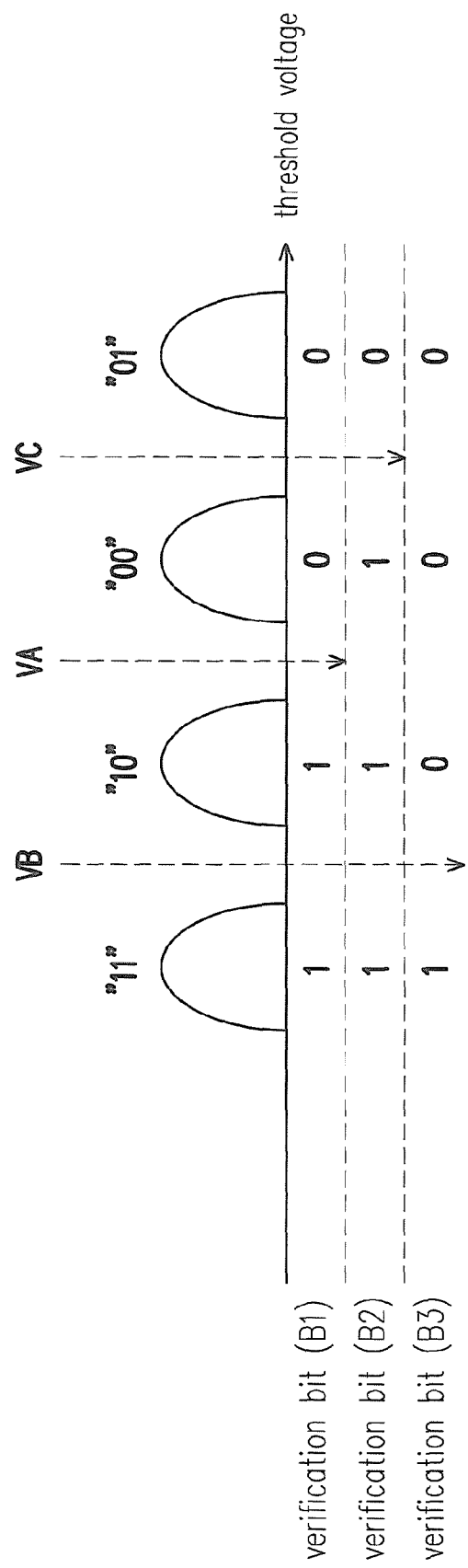
FIG. 10 illustrates a schematic diagram for reading data from memory cells according to an exemplary embodiment of the invention.

FIG. 10 illustrates a schematic diagram for reading data from memory cells according to an exemplary embodiment of the invention, which uses a MLC NAND flash memory for example.

Referring to FIG. 10, in a reading operation for the memory cells of a physical programming unit, the read voltage is applied to the control gate, and data stored in the memory cells are identified according whether each channel of the memory cells is turned on. A verification bit (B1) is configured to indicate whether the channel of the memory cell is turned on when a read voltage VA is applied; a verification bit (B2) is configured to indicate whether the channel of the memory cell is turned on when a read voltage VC is applied; and a verification bit (B3) is configured to indicate whether the channel of the memory cell is turned on when a read voltage VB is applied. It is assumed that a corresponding channel of a specific memory cell being turned on is indicated by the verification bit being "1," and the corresponding channel of the specific memory cell not being turned on is indicated by the verification bit being "0." Note here that the channel is turned on while the corresponding threshold voltage is less than the read voltage, while off otherwise. As shown in FIG. 10, which of the storage statuses the specific memory cell is in may be determined according to the verification bits (B1) to (B3), thereby obtaining the data being stored.

Figure 11:
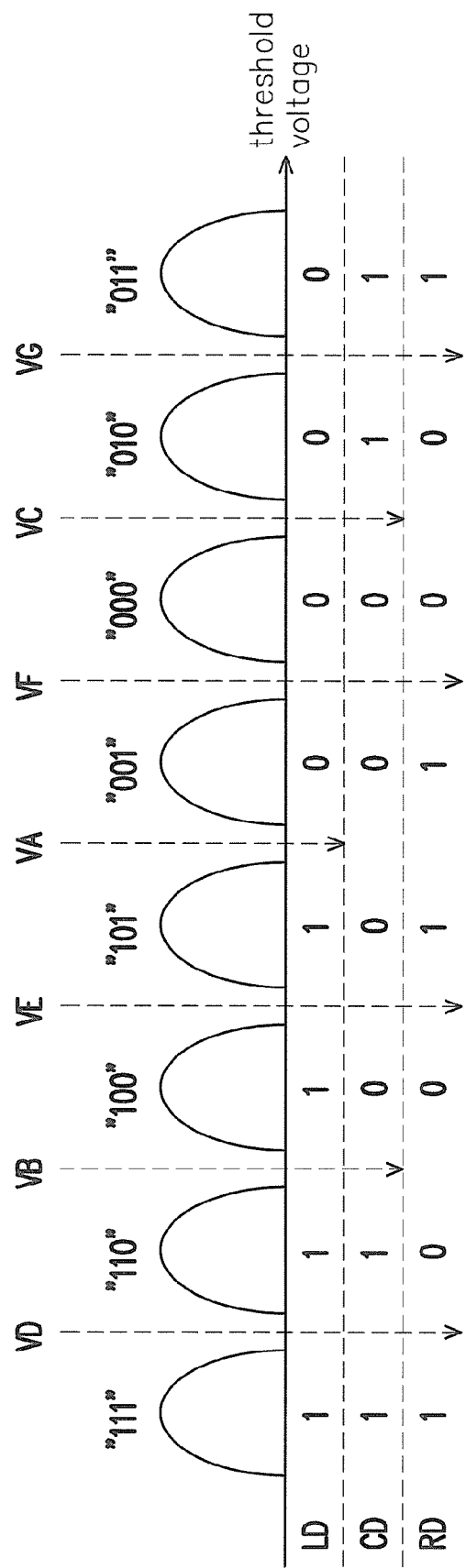
FIG. 11 illustrates a schematic diagram for reading data from memory cells according to another exemplary embodiment of the invention.

FIG. 11 illustrates a schematic diagram for reading data from memory cells according to another exemplary embodiment of the invention.

Figure 12:
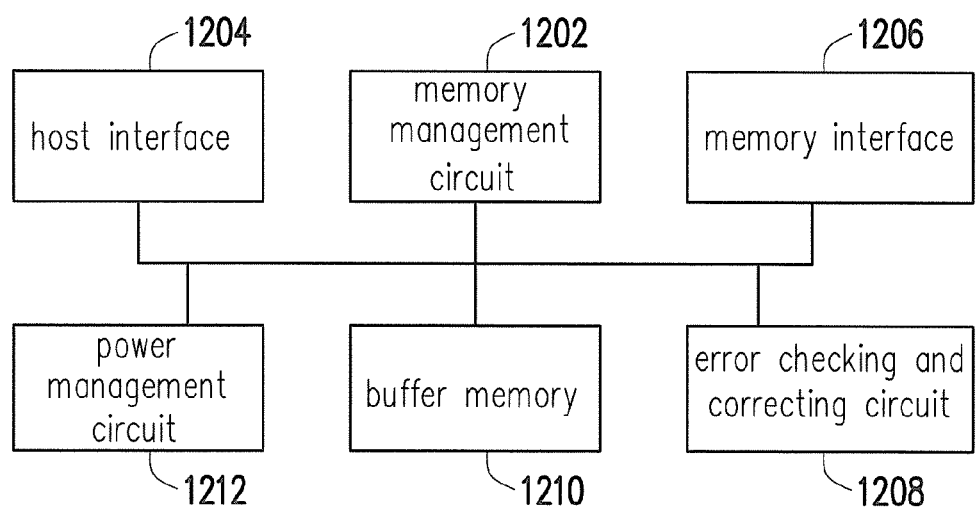
FIG. 12 is a schematic block diagram illustrating a memory controlling circuit unit according to an exemplary embodiment of the invention.

Referring to FIG. 11 which takes a TLC NAND flash memory for example, each of the storage statues (or, states) comprises a first digit counted from the left being the left digit (LD), a second bit counted from the left being the center digit (CD) and a third bit counted from the left being the right digit (RD). In this exemplary embodiment, a memory cell comprises eight storage statuses (or, states) depending on eight different threshold voltages (i.e., "111," "110," "100," "101," "001," "000," "010" and "011"). The bits stored in the memory cell may be identified by applying the read voltages VA to VG to the control gate. Therein, it should be noted that, an arranging sequence of the eight storage statuses may be decided based on the designs of manufacturers without being limited by the arranging sequence of this embodiment FIG. 12 is a schematic block diagram illustrating a memory controlling circuit unit according to an exemplary embodiment of the invention. It should be understood that, the structure of the memory controlling circuit unit depicted in FIG. 12 is only an example, and the invention is not limited thereto.

Referring to FIG. 12, the memory controlling circuit unit 404 comprises a memory management circuit 1202, a host interface 1204, a memory interface 1206 and an error checking and correcting circuit 1208.

The memory management circuit 1202 is configured to control overall operations of the memory controlling circuit unit 404. Specifically, the memory management circuit 1202 has a plurality of control commands. During operations of the memory storage device 10, the control commands are executed to execute various operations such as writing, reading and erasing data. The operations of the memory controlling circuit unit 404 are similar to the operations of the memory management circuit 1202, thus related description is omitted hereinafter.

In the present exemplary embodiment, the control commands of the memory management circuit 1202 are implemented in a form of a firmware. For instance, the memory management circuit 1202 has a microprocessor unit (not illustrated) and a ROM (not illustrated), and the control commands are burned into the ROM. When the memory storage device 10 operates, the control commands are executed by the microprocessor to perform operations of writing, reading or erasing data.

In another exemplary embodiment of the invention, the control commands of the memory management circuit 1202 may also be stored as program codes in a specific area (for example, the system area in a memory exclusively used for storing system data) of the rewritable non-volatile memory module 406. In addition, the memory management circuit 1202 has a microprocessor unit (not illustrated), a ROM (not illustrated) and a RAM (not illustrated). Particularly, the ROM has an activation code, which is executed by the microprocessor unit to load the control commands stored in the rewritable non-volatile memory module 406 to the RAM of the memory management circuit 1202 when the memory controlling circuit unit 404 is enabled. Thereafter, the control commands are executed by the microprocessor unit to execute operations of writing, reading or erasing data.

Further, in another exemplary embodiment of the invention, the control commands of the memory management circuit 1202 may also be implemented in a form of hardware. For example, the memory management circuit 1202 comprises a microprocessor, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the microprocessor. The memory management circuit is configured to manage the physical blocks of the rewritable non-volatile memory module 406; the memory writing circuit is configured to issue a write command to the rewritable non-volatile memory module 406 in order to write data into the rewritable non-volatile memory module 406; the memory reading circuit is configured to issue a read command to the rewritable non-volatile memory module 406 in order to read data from the rewritable non-volatile memory module 406; the memory erasing circuit is configured to issue an erase command to the rewritable non-volatile memory module 406 in order to erase data from the rewritable non-volatile memory module 406; the data processing circuit is configured to process both the data to be written to the rewritable non-volatile memory module 406 and the data to be read from the rewritable non-volatile memory module 406.

The host interface 1204 is coupled to the memory management circuit 1202 and configured to receive and identify commands and data sent from the host system 11. In other words, the commands and data sent from the host system 11 are passed to the memory management circuit 1202 through the host interface 1204. In the present exemplary embodiment, the host interface 1204 is compatible with a SATA standard. However, it should be understood that the present invention is not limited thereto, and the host interface 1204 may also be compatible with a PATA standard, an IEEE 1394 standard, a PCI Express standard, a USB standard, a SD standard, a UHS-I standard, a UHS-II standard, an MS standard, an MMC standard, an eMMC standard, a UFS standard, a CF standard, an IDE standard, or other suitable standards for data transmission.

The memory interface 1206 is coupled to the memory management circuit 1202 and configured to access the rewritable non-volatile memory module 406. That is, data to be written to the rewritable non-volatile memory module 406 is converted to a format acceptable to the rewritable non-volatile memory module 406 through the memory interface 1206. In particular, if the memory management circuit 1202 intends to access the rewritable non-volatile memory module 406, the memory interface 1206 sends corresponding command sequences. The command sequences may comprise one or more signals, or data from the bus. For example, in a read command sequence, information such as identification codes and memory addresses are comprised.

The error checking and correcting circuit 1208 is coupled to the memory management circuit 1202 and configured to execute an error checking and correcting process to ensure the correctness of data. In particular, when the memory management circuit 1202 receives the write command from the host system 11, the error checking and correcting circuit 1208 generates an error correcting code (ECC) and/or an error detecting code (EDC) for data corresponding to the write command, and the memory management circuit 1202 writes the data and the ECC and/or the EDC corresponding to the write command into the rewritable non-volatile memory module 406. Subsequently, when the memory management circuit 1202 reads the data from the rewritable non-volatile memory module 406, the corresponding ECC and/or the EDC is also read from the rewritable non-volatile memory module 406, so that the error checking and correcting circuit 1208 can execute the error checking and correcting procedure on the read data based on the ECC and/or the EDC. In this exemplary embodiment, a low density parity code (LDPC) is used by the error checking and correcting circuit 1208. However, in another exemplary embodiment, the error checking and correcting circuit 1208 may also use a BCH code, a convolutional code, a turbo code, but the invention is not limited thereto.

In an exemplary embodiment, the memory controlling circuit unit 404 further comprises a buffer memory 1210 and a power management circuit 1212. The buffer memory 1210 is coupled to the memory management circuit 1202 and configured to temporarily store data and commands from the host system 11 or data from the rewritable non-volatile memory module 406. The power management unit 1212 is coupled to the memory management circuit 1202 and configured to control a power of the memory storage device 10.

In the present exemplary embodiment, the memory management circuit 1202 may scan the memory cells in the rewritable non-volatile memory module 406, so as to obtain a threshold voltage distribution of the memory cells. For example, the memory management circuit 1202 may scan one or more physical erasing units or one or more physical programming units. Taking the threshold voltage distribution as shown in FIG. 9 as an example, the threshold voltage distribution comprises four states 910 to 940. Each of the states 910 to 940 covers a voltage range and represents a storage status of the MLC NAND flash memory module. For example, in case a threshold voltage of a specific memory cell is in state 910, it represents that the specific memory cell stores bits "11"; in case the threshold voltage of the specific memory cell is in state 920, it represents that the specific memory cell stores bits "10"; in case the threshold voltage of the specific memory cell is in state 930, it represents that the specific memory cell stores bits "00"; in case the threshold voltage of the specific memory cell is in state 940, it represents that the specific memory cell stores bits "01." In another exemplary embodiment, each of the states may be referred as a peak.

In the present exemplary embodiment, a gap window may exist between two neighboring states. For example, a gap window GW1 exists between state 910 and state 920; a gap window GW2 exists between state 920 and state 930; a gap window GW3 exists between state 930 and state 940, as shown in FIG. 9. The read voltages, such as VA, VB and VC, may be applied to one of the gap windows GW2, GW1, and GW3, respectively, thereby the bits stored in a memory cell may be read, as shown in FIG. 10 or FIG. 11. If the width of a gap window is broad enough, the read bits through applying the corresponding read voltage may be more accurate; however, if the width of a gap window is too narrow, the read bits through the corresponding read voltage may be less accurate.

Figure 13:
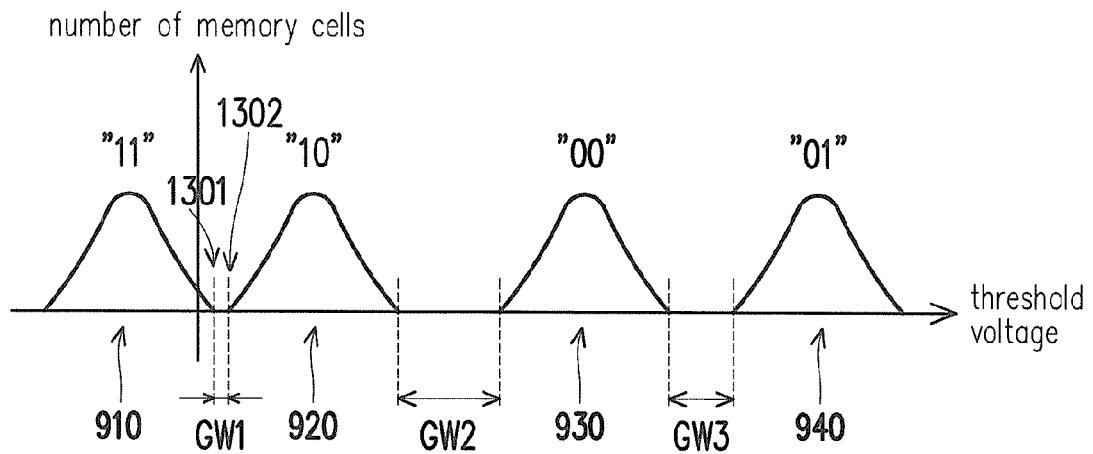
FIG. 13 and FIG. 14 illustrate a threshold voltage distribution of the memory cells according to an exemplary embodiment of the invention.
Figure 14:
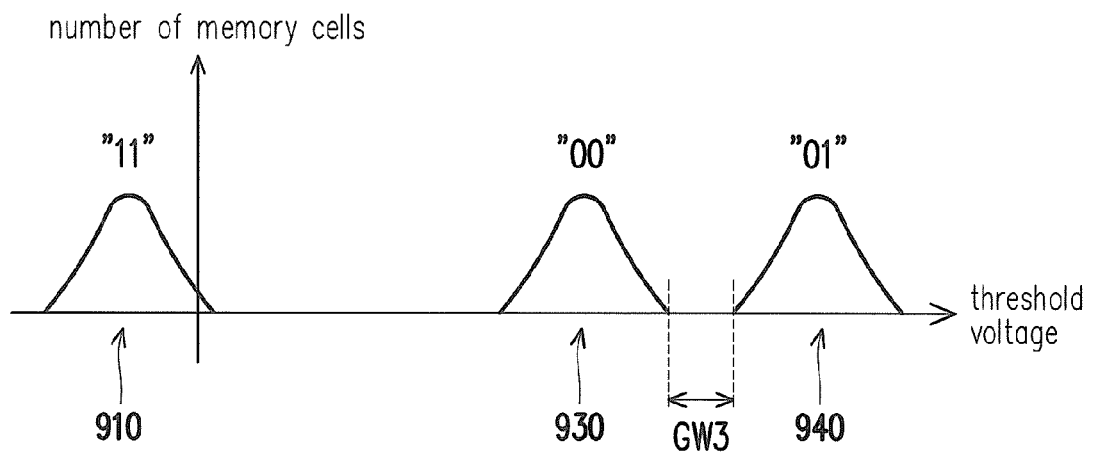

FIG. 13 and FIG. 14 illustrate a threshold voltage distribution of the memory cells according to an exemplary embodiment of the invention.

Referring to FIG. 13, with respect to the threshold voltage distribution shown in FIG. 9, the width of gap window GW1 in the threshold voltage distribution of the present exemplary embodiment are changed; more accurately, the width of the gap window GW1 becomes much narrower. Generally, the reason for this degradation may be owing to the increase of the access count (e.g., reading count, erasing count and/or writing count) to the memory cells, too long retention time that data has been stored in the memory cells, and other issues making the memory cells degradation in reliability. In this event, there is a high possibility to be unable to distinguish the storage statuses when a read voltage is applied to the gap window GW1.

In the present exemplary embodiment, the memory management circuit 1202 obtains a width of a gap window between two neighboring states among the states and determines whether the width of the gap window is less than a threshold value. If the width of the gap window is less than the threshold value, the memory management circuit 1202 eliminates one of the two neighboring states. In the present exemplary embodiment, a tolerance in read voltage ($\Delta$) may be set as the threshold. The value of $\Delta$ may be configured by the manufacture or the user. For example, the value of $\Delta$ may be related to a tolerance range which is bigger enough for distinguishing two neighboring state, and the value of $\Delta$ is not limited by this invention.

Taking the gap window GW1 as shown in FIG. 13 as an example, the memory management circuit 1202 may obtain an upper terminal voltage 1301 of the state 910 (also known as a first neighboring state) and a lower terminal voltage 1302 of the state 920 (also known as a second neighboring state) according to the threshold voltage distribution. Here, a peak voltage (also known as a first peak voltage) of the first neighboring state is lower than a peak voltage (also known as a second peak voltage) of the second neighboring state. Namely, the threshold voltage of any memory cell belonging to the first neighboring state is lower than the threshold voltage of any memory cell belonging to the second neighboring state. The memory management circuit 1202 may then obtain the width of the gap window GW1 according to the upper terminal voltage 1301 and the lower terminal voltage 1302. Similarly, the memory management circuit 1202 may obtain the widths of the gap windows GW2 and GW3. The memory management circuit 1202 determines whether the width of the gap window GW1 is less than the threshold (e.g., A). In this case, it is assumed that the gap window GW1 is less than the threshold value, and thereby the memory management circuit 1202 eliminates state 920. It should be understood that, the operation of eliminating one specific state indicates to ignore a corresponding storage status in the next programming process. That is, in the next programming process of the memory cells, the remaining storage status of the memory cells may only comprise "11," "00" and "01," as illustrated in FIG. 14. However, the remaining storage status may be changed according to different design and not limited as above.

Referring to FIG. 14, after eliminating the state 920, the threshold voltage distribution only comprises states 910, 930 and 940. The memory management circuit 1202 may compare the new gap window between the states 910 and 930. It is assumed that the new gap window between the states 910 and 930 is not less than the threshold value. The memory management circuit 1202 further determines whether the gap window GW3 is less than the threshold value. It is assumed that the gap window GW3 is not less than the threshold value, then the memory management circuit 1202 does not eliminate the state 930 or state 940.

In another exemplary embodiment, however, two neighboring states may be partially overlapped with each other, and the terminal voltages or the gap windows between the two neighboring states may not be found. In this case, the memory management circuit 1202 may determine whether the first neighboring state among the two neighboring states is overlapped with the second neighboring state among the two neighboring states. If the first neighboring state is overlapped with the second neighboring state, the memory management circuit 1202 directly determines that the width of the gap window between the two neighboring states is less than the threshold value, rather than finding the width of the gap window. If the first neighboring state is not overlapped with the second neighboring state, the memory management circuit 1202 performs the operation of obtaining the width of the gap window.

It should be understood that, in an exemplary embodiment, the operation of obtaining the threshold voltage distribution may comprises means for obtaining the threshold voltage information of parts of the memory cells, rather than "actually" scanning all of the memory cells.

Figure 15:
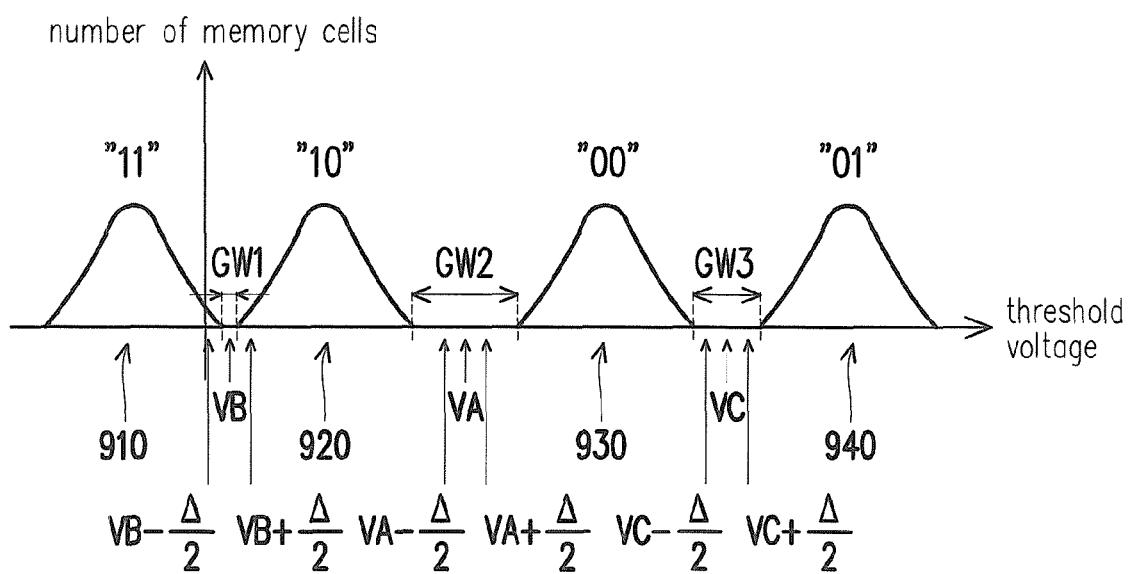
FIG. 15 is a threshold voltage distribution of the memory cells according to another exemplary embodiment of the invention.

FIG. 15 is a threshold voltage distribution of the memory cells according to another exemplary embodiment of the invention.

Referring to FIG. 15, the memory management circuit 1202 may apply read voltages VB−$\Delta$/2 and VB+$\Delta$/2 into the gap window GW1. According to the obtained data in response to the read voltage VB−$\Delta$/2 and VB+$\Delta$/2, the memory management circuit 1202 may distinguish whether the width of the gap window GW1 is less than the width of $\Delta$ (i.e., the threshold). Similarly, the memory management circuit 1202 may apply read voltages VA−$\Delta$/2 and VA+$\Delta$/2 into the gap window GW2 and/or apply read voltages VC−$\Delta$/2 and VC+$\Delta$/2 into the gap window GW3, so as to distinguish whether the width of the gap windows GW2 and/or GW3 is less than the width of $\Delta$ (i.e., the threshold), respectively. Here, the read voltage VA may be the default read voltage or an optimal real voltage for reading the left digit in the memory cells, and the read voltage VB or VC may be the default read voltage or an optimal real voltage for reading the right digit in the memory cells. However, more read voltage may be applied for distinguishing whether a width of the gap window is less than the threshold value, which is not limited by the invention.

In an exemplary embodiment of FIG. 13, the threshold voltage distribution comprises four states 910 to 940, in which the peak voltage of state 910 is lower than the peak voltage of state 920, the peak voltage of state 920 is lower than the peak voltage of state 930, and the peak voltage of state 930 is lower than the peak voltage of state 940. During the operation of eliminating one of the two neighboring states, if the current two neighboring states are the state 910 and the state 920, the memory management circuit 1202 may eliminate the state 920; if the current two neighboring states are the state 920 and the state 930, the memory management circuit 1202 may eliminate the state 930; if the current two neighboring states are the state 930 and the state 940, the memory management circuit 1202 may eliminate the state 940. However, in another exemplary embodiment, any one of the current two neighbor state may be eliminated. For example, in another exemplary embodiment, the memory management circuit 1202 may eliminate the state 930 and keep using the state 940. The disclosure is not limited thereof. In other words, during the operation of eliminating one of the two neighboring states, the state with higher peak voltage may be eliminated; however, regarding to some specific states, the state with lower peak voltage may be eliminated, which is not limited by the disclosure.

Moreover, an determination order (i.e., checking order) may be applied to the gap windows in the threshold voltage distribution. For example, in the above exemplary embodiment of FIG. 13, the memory management circuit 1202 firstly determines whether the width of the gap window GW1 is less than the threshold value; if the width of the gap window GW1 is less than the threshold value, the memory management circuit 1202 eliminates the state 920 and determines whether the gap window GW3 is less than the threshold value. In another exemplary embodiment, however, the determination order may be different. For example, the memory management circuit 1202 may firstly determine whether the width of the gap window GW2 or GW3 is less than the threshold value; if the width of the gap window GW2 or GW3 is less than the threshold value, the memory management circuit 1202 eliminates the corresponding state and then determines whether at least one of the remaining gap window is less than the threshold. The determination order is not limited by the invention. That is, the operations of determining whether the width of a specific gap window between two neighboring states is less than the threshold and eliminating one of the two neighboring states may be repeatedly performed until the width of each of the remaining gap windows is not less than the threshold. That is, in an exemplary embodiment of FIG. 13, the corresponding physical erasing unit using the four states containing at least one gap window which is narrowed than the threshold value may be regarded as degraded, and the corresponding physical erasing unit may be useless without the above eliminating operation. However, after performing the above eliminating operation, the memory cells may be continuously used rather than being abandoned, and the lifetime of the rewritable non-volatile memory module 406 may be extended.

In an exemplary embodiment, the memory management circuit 1202 may assign a label to each of the states in the threshold voltage distribution and set a first checking pivot and a second checking pivot. Those pivots form a selected pair of two neighboring states. Here, the first checking pivot and the second checking pivot point to the two different labels, respectively. For example, the first checking pivot points to the label of the first neighboring voltage, and the second checking pivot points to the label of the second neighboring voltage. The memory management circuit 1202 selects the two neighboring states according to the first checking pivot and the second checking pivot. In response to eliminating one of the two neighboring states, the memory management circuit 1202 re-assigns the label previously assigned to the eliminated state to a next state among the states, in which a peak voltage of the next state is higher than a peak voltage of the eliminated state (i.e., the threshold voltage of some memory cell belonging to the next state is higher than that of some memory cell belonging to the eliminated state). That is, in case that the eliminated state and the next state are not overlapped, the threshold voltage of any memory cell belonging to the next state is higher than that of any memory cell belonging to the eliminated state. However, if the eliminated state and the next state are partially overlapped, then some memory cells belonging the eliminated states and some memory cells belonging to the next states, for example, in the overlapped region, may have the same threshold voltage. Taking FIG. 13 and FIG. 14 as an example, it is assumed that the states 910 to 940 are assigned labels "0," "1," "2" and "3," respectively. After the state 910 is eliminated, the label "0" assigned to the state 910 is not changed, and the label "1" and the label "2" are re-assigned to the state 930 and 940, respectively. Besides, after a determination operation (e.g., the determination operation of determining whether the gap window GW1 is less than the threshold) is performed, the first checking pivot and the second checking pivot are updated. For example, in the exemplary embodiment of FIG. 13, the first checking pivot originally points to the label "0" and the second checking pivot originally points to the label "1," and the states 910 and 920 are firstly selected as the two neighboring states accordingly; then, in the exemplary embodiment of FIG. 14, after the state 920 being eliminated, the first checking pivot first is updated to point to the label "1" and the second checking pivot first points to the label "2," such that the memory management circuit 1202 may select the states 930 and 940 as the next two neighboring states. However, after the determination operation, if it is determined that the gap window between those two neighboring states is not less than the threshold value, then the pivots are also updated. For example, the pivots may move to a next pair of two neighboring states. For example, the first checking pivot moves to the state previously assigned as the second checking pivot and the second checking pivot moves to next state not yet being selected, in which the threshold voltage of any memory cell belonging to the next state is higher than that of any memory cell belonging to the state previously assigned as the second checking pivot. It should be noticed that, in another exemplary embodiment, the reassigning mechanism may be different in response to different determination order.

It should be understood that, although the above exemplary embodiments are illustrated by taking the MLC NAND flash memory module as the examples, however, in another exemplary embodiment, the operations described above may be applied to any kind of the rewritable non-volatile memory module 406.

Figure 16:
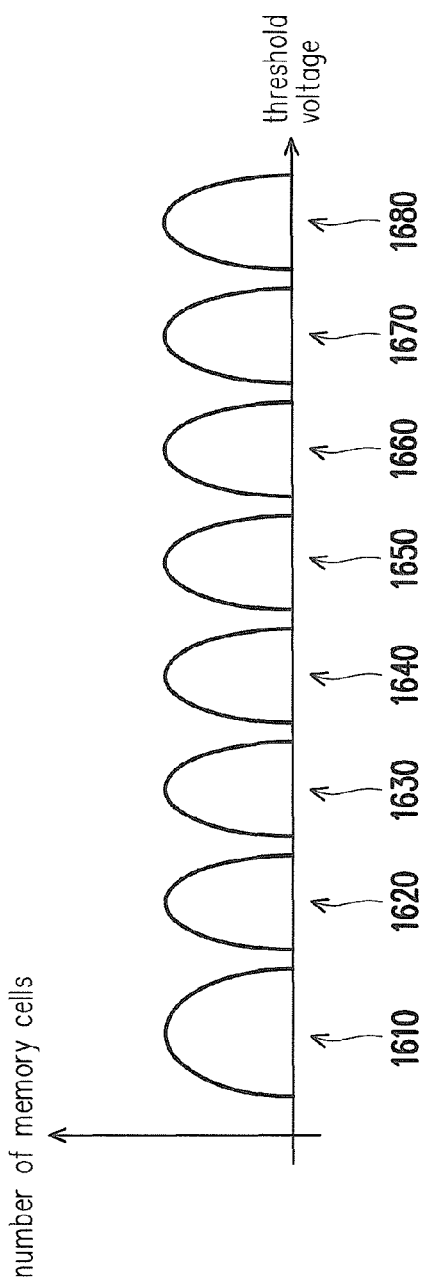
FIG. 16 and FIG. 17 are the threshold voltage distributions of the memory cells according to another exemplary embodiment of the invention.
Figure 17:
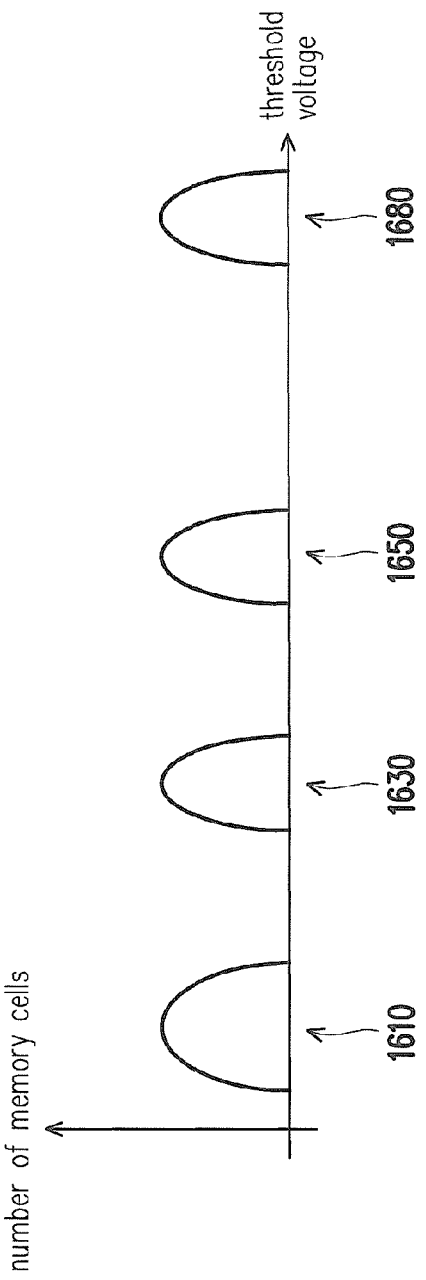

FIG. 16 and FIG. 17 are the threshold voltage distributions of the memory cells according to another exemplary embodiment of the invention.

Referring to FIG. 16 which illustrates a threshold voltage distribution of the memory cells in the rewritable non-volatile memory module 406 with TLC NAND flash memory module. In this exemplary embodiment, the threshold voltage distribution comprises eight states 1610 to 1680. It is assumed that the width of each of the gap windows between two neighboring states is less than the threshold. The memory management circuit 1202 may first determine whether the width of the gap window between states 1610 and 1620 is less than the threshold and eliminate the state 1620 accordingly; then, the memory management circuit 1202 may determine whether the width of the gap window between states 1630 and 1640 is less than the threshold and eliminate the state 1640 accordingly; then, the memory management circuit 1202 may determine whether the width of the gap window between states 1650 and 1660 is less than the threshold and eliminate the state 1660 accordingly; and then, the memory management circuit 1202 may determine whether the width of the gap window between states 1670 and 1680 is less than the threshold and eliminate the state 1670 accordingly. In this case, the four states 1610, 1630, 1650 and 1680 are remained, as illustrated in FIG. 17. The gap windows between any two neighboring states in this threshold voltage distribution are all larger than the threshold. The memory cells, originally used as TLC, exhibiting the threshold voltage distribution in FIG. 16 is not totally eliminated; and thereby is still useful as MLC in FIG. 17 as an example.

In the above exemplary embodiments, only the first state (e.g., states 910 and 1610) and the last state (e.g., states 940 and 1680) in the threshold voltage distribution cannot be eliminated. However, in another exemplary embodiment, each of the states in the threshold voltage distribution can be eliminated if necessary.

Figure 18:
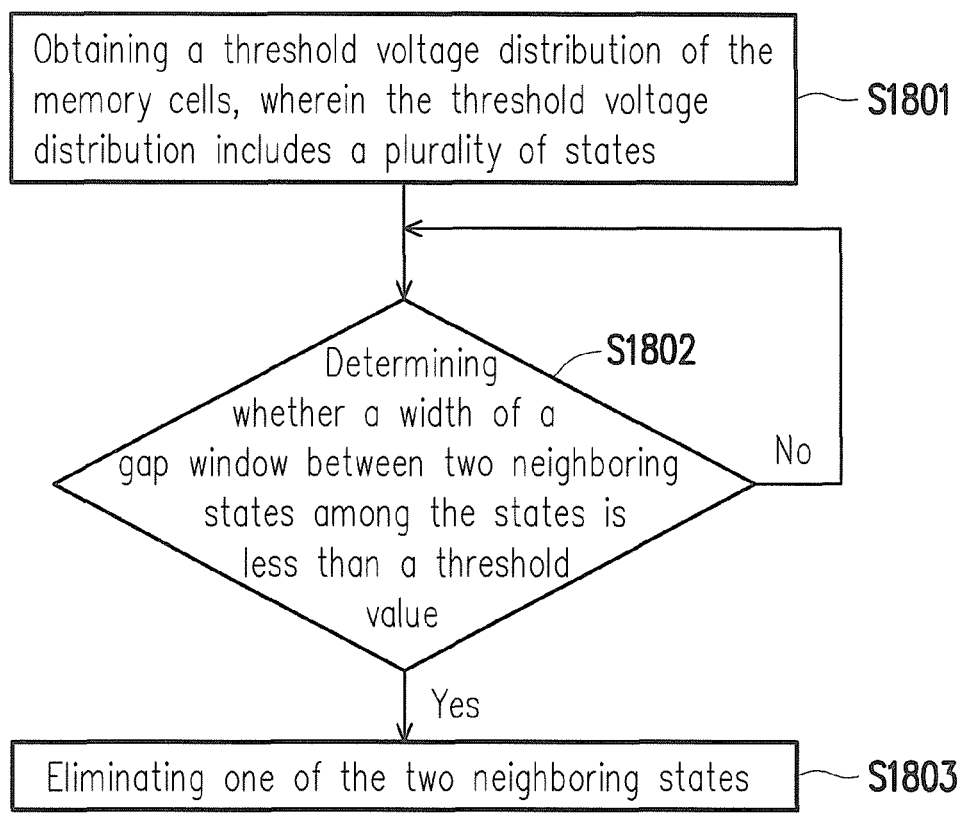
FIG. 18 is a flowchart illustrating an memory management method according to an exemplary embodiment of the invention.

FIG. 18 is a flowchart illustrating an memory management method according to an exemplary embodiment of the invention.

Referring to FIG. 18, in step S1801, a threshold voltage distribution of the memory cells is obtained, wherein the threshold voltage distribution comprises a plurality of states, and each of the states represents a storage status. In step S1802, whether a width of a gap window between two neighboring states among the states is less than a threshold is determined. If the width of the gap window is less than the threshold value, in step S1803, one of the two neighboring states is eliminated. If the width of the gap window is less than the threshold value, the step 1802 may be repeatedly performed, so as to check a next gap window until each of the remaining gap windows is not less than the threshold. The steps 1802 and steps 1803 may be repeatedly performed until the width of each of the remaining gap windows is not less than the threshold.

However, each step of FIG. 18 has been described in detail above and will not repeated hereinafter. It should be noted that each of the steps illustrated in FIG. 18 may be implemented as a plurality of program codes or circuits, but construes no limitations to the present invention. Additionally, the method illustrated in FIG. 18 may be implemented together with the exemplary embodiments above or may be performed solely, and the present invention is not limited thereto.

In summary, the gap window with inappropriate width between two neighboring states may be found, and one of the two neighboring states may be eliminated. Accordingly, error bits contained in data read from the rewritable non-volatile memory module may be reduced and the lifetime of the rewritable non-volatile memory module may be extended.

Although the present invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

The previously described exemplary embodiments of the present invention have the advantages aforementioned, wherein the advantages aforementioned not required in all versions of the invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An memory management method for a rewritable non-volatile memory module comprising a plurality of memory cells, and the memory management method comprising:
    obtaining a threshold voltage distribution of the memory cells, wherein the threshold voltage distribution comprises a plurality of states, and each of the states represents a storage status;
    determining whether a width of a gap window between two neighboring states among the states is less than a threshold value; and
    if the width of the gap window is less than the threshold value, eliminating one of the two neighboring states.

2. The memory management method of claim 1, wherein the two neighboring states comprises a first neighboring state and a second neighboring state, a first peak voltage of the first neighboring state is lower than a second peak voltage of the second neighboring state, and the memory management method further comprises:
    obtaining an upper terminal voltage of the first neighboring state and a lower terminal voltage of the second neighboring state according to the threshold voltage distribution; and
    obtaining the width of the gap window according to the upper terminal voltage of the first neighboring state and the lower terminal voltage of the second neighboring state.

3. The memory management method of claim 2, further comprising:
    determining whether the first neighboring state is overlapped with the second neighboring state;
    if the first neighboring state is overlapped with the second neighboring state, directly determining that the width of the gap window is less than the threshold value; and
    if the first neighboring state is not overlapped with the second neighboring state, performing the step of obtaining the width of the gap window.

4. The memory management method of claim 1, wherein the step of obtaining the threshold voltage distribution of the memory cells comprises:
    applying a first read voltage and a second read voltage between the two neighboring states, wherein the second read voltage is higher than the first read voltage, and a difference value of the first read voltage and the second read voltage is equal to the threshold value,
    wherein the step of determining whether the width of the gap window is less than the threshold comprises:
    distinguishing whether the width of the gap window is less than the threshold according to the obtained bits in response to the first read voltage and the second read voltage.

5. The memory management method of claim 1, wherein a peak voltage of the eliminated state is higher than the peak voltage of the remaining state.

6. The memory management method of claim 1, wherein a peak voltage of the eliminated state is lower than the peak voltage of the remaining state.

7. The memory management method of claim 1, further comprising:
    assigning a label to each of the states; and
    setting a first checking pivot and a second checking pivot, wherein each of the first checking pivot and the second checking pivot points to one of the labels;
    selecting the two neighboring states according to the first checking pivot and the second checking pivot; and
    in response to eliminating one of the two neighboring states, re-assigning the label previously assigned to the eliminated state to a next state among the states, wherein a peak voltage of the next state is higher than a peak voltage of the eliminated state.

8. A memory storage device, comprising:
    a connection interface unit, configured to couple to a host system;
    a rewritable non-volatile memory module comprising a plurality of memory cells; and a memory controlling circuit unit, coupled to the connection interface unit and the rewritable non-volatile memory module, wherein the memory controlling circuit unit is configured to obtain a threshold voltage distribution of the memory cells, wherein the threshold voltage distribution comprises a plurality of states, and each of the states represents a storage status, wherein the memory controlling circuit unit is further configured to determine whether a width of a gap window between two neighboring states among the states is less than a threshold value, wherein if the width of the gap window is less than the threshold value, the memory controlling circuit unit is further configured to eliminate one of the two neighboring states.

9. The memory storage device of claim 8, wherein the two neighboring states comprises a first neighboring state and a second neighboring state, a first peak voltage of the first neighboring state is lower than a second peak voltage of the second neighboring state, wherein the memory controlling circuit unit is further configured to obtain an upper terminal voltage of the first neighboring state and a lower terminal voltage of the second neighboring state according to the threshold voltage distribution, wherein the memory controlling circuit unit is further configured to obtain the width of the gap window according to the upper terminal voltage of the first neighboring state and the lower terminal voltage of the second neighboring state.

10. The memory storage device of claim 9, wherein the memory controlling circuit unit is further configured to determine whether the first neighboring state is overlapped with the second neighboring state, wherein if the first neighboring state is overlapped with the second neighboring state, the memory controlling circuit unit is further configured to directly determine that the width of the gap window is less than the threshold value, wherein if the first neighboring state is not overlapped with the second neighboring state, the memory controlling circuit unit is further configured to perform the operation of obtaining the width of the gap window.

11. The memory storage device of claim 8, wherein the operation of obtaining the threshold voltage distribution of the memory cells comprises:

applying a first read voltage and a second read voltage between the two neighboring states, wherein the second read voltage is higher than the first read voltage, and a difference value of the first read voltage and the second read voltage is equal to the threshold value, wherein the operation of determining whether the width of the gap window is less than the threshold comprises:

distinguishing whether the width of the gap window is less than the threshold according to the obtained bits in response to the first read voltage and the second read voltage.

12. The memory storage device of claim 8, wherein a peak voltage of the eliminated state is higher than the peak voltage of the remaining state.

13. The memory storage device of claim 8, wherein a peak voltage of the eliminated state is lower than the peak voltage of the remaining state.

14. The memory storage device of claim 8, wherein the memory controlling circuit unit is further configured to assign a label to each of the states, wherein the memory controlling circuit unit is further configured to set a first checking pivot and a second checking pivot, wherein each of the first checking pivot and the second checking pivot points to one of the labels, wherein the memory controlling circuit unit is further configured to select the two neighboring states according to the first checking pivot and the second checking pivot, wherein the memory controlling circuit unit is further configured to re-assigning the label previously assigned to the eliminated state to a next state among the states in response to eliminating one of the two neighboring states, wherein a peak voltage of the next state is higher than a peak voltage of the eliminated state.

15. A memory controlling circuit unit, configured to control a rewritable non-volatile memory module, and the memory controlling circuit unit comprising:

a host interface, configured to couple to a host system;

a memory interface, configured to couple to the rewritable non-volatile memory module, wherein the rewritable non-volatile memory module comprises a plurality of memory cells; and a memory management circuit coupled to the host interface and the memory interface, wherein the memory management circuit is configured to obtain a threshold voltage distribution of the memory cells, wherein the threshold voltage distribution comprises a plurality of states, and each of the states represents a storage status, wherein the memory management circuit is further configured to determine whether a width of a gap window between two neighboring states among the states is less than a threshold value, wherein if the width of the gap window is less than the threshold value, the memory management circuit is further configured to eliminate one of the two neighboring states.

16. The memory controlling circuit unit of claim 15, wherein the two neighboring states comprises a first neighboring state and a second neighboring state, a first peak voltage of the first neighboring state is lower than a second peak voltage of the second neighboring state, wherein the memory management circuit is further configured to obtain an upper terminal voltage of the first neighboring state and a lower terminal voltage of the second neighboring state according to the threshold voltage distribution, wherein the memory management circuit is further configured to obtain the width of the gap window according to the upper terminal voltage of the first neighboring state and the lower terminal voltage of the second neighboring state.

17. The memory controlling circuit unit of claim 16, wherein the memory management circuit is further configured to determine whether the first neighboring state is overlapped with the second neighboring state, wherein if the first neighboring state is overlapped with the second neighboring state, the memory management circuit is further configured to directly determine that the width of the gap window is less than the threshold value, wherein if the first neighboring state is not overlapped with the second neighboring state, the memory management circuit is further configured to perform the operation of obtaining the width of the gap window.

18. The memory controlling circuit unit of claim 15, wherein the operation of obtaining the threshold voltage distribution of the memory cells comprises:

applying a first read voltage and a second read voltage between the two neighboring states, wherein the second read voltage is higher than the first read voltage, and a difference value of the first read voltage and the second read voltage is equal to the threshold value, wherein the operation of determining whether the width of the gap window is less than the threshold comprises:

distinguishing whether the width of the gap window is less than the threshold according to the obtained bits in response to the first read voltage and the second read voltage.

19. The memory controlling circuit unit of claim 15, wherein a peak voltage of the eliminated state is higher than the peak voltage of the remaining state.

20. The memory controlling circuit unit of claim 15, wherein a peak voltage of the eliminated state is lower than the peak voltage of the remaining state.

21. The memory controlling circuit unit of claim 15, wherein the memory management circuit is further configured to assign a label to each of the states, wherein the memory management circuit is further configured to set a first checking pivot and a second checking pivot, wherein each of the first checking pivot and the second checking pivot points to one of the labels, wherein the memory management circuit is further configured to select the two neighboring states according to the first checking pivot and the second checking pivot, wherein the memory management circuit is further configured to re-assigning the label previously assigned to the eliminated state to a next state among the states in response to eliminating one of the two neighboring states, wherein a peak voltage of the next state is higher than a peak voltage of the eliminated state.

* * * * *